(12) United States Patent
Hwang et al.

(10) Patent No.: US 9,363,888 B2
(45) Date of Patent: Jun. 7, 2016

(54) CONDUCTIVE SUBSTRATE AND TOUCH SCREEN HAVING SAME

(75) Inventors: Ji Young Hwang, Daejeon (KR); In-Seok Hwang, Daejeon (KR); Seung Heon Lee, Daejeon (KR); Sang Ki Chun, Daejeon (KR); Yong Goo Son, Daejeon (KR); Beom Mo Koo, Daejeon (KR); Jiehyun Seong, Daejeon (KR); Joo Yeon Kim, Daejeon (KR); Je Seob Park, Seoul (KR)

(73) Assignee: LG CHEM, LTD., Seoul (KR)

( * ) Notice: Subject to any disclaimer, the term of this patent is extended or adjusted under 35 U.S.C. 154(b) by 474 days.

(21) Appl. No.: 14/008,522

(22) PCT Filed: Mar. 28, 2012

(86) PCT No.: PCT/KR2012/002283
§ 371 (c)(1),
(2), (4) Date: Sep. 27, 2013

(87) PCT Pub. No.: WO2012/134173
PCT Pub. Date: Oct. 4, 2012

(65) Prior Publication Data
US 2014/0022739 A1  Jan. 23, 2014

(30) Foreign Application Priority Data

Mar. 28, 2011 (KR) .......................... 10-2011-0027832

(51) Int. Cl.
*G06F 3/041* (2006.01)
*H05K 1/02* (2006.01)
*G02F 1/1333* (2006.01)

(52) U.S. Cl.
CPC .......... *H05K 1/0274* (2013.01); *G02F 1/13338* (2013.01); *G06F 3/041* (2013.01)

(58) Field of Classification Search
None
See application file for complete search history.

(56) References Cited

U.S. PATENT DOCUMENTS

| | | | |
|---|---|---|---|
| 2009/0079919 | A1 | 3/2009 | Niioka et al. |
| 2009/0180189 | A1 | 7/2009 | Lee |
| 2010/0013785 | A1 | 1/2010 | Murai et al. |
| 2010/0013798 | A1 | 1/2010 | Nakajima et al. |
| 2010/0136288 | A1 | 6/2010 | Tanaka et al. |
| 2010/0147577 | A1 | 6/2010 | Tanaka et al. |
| 2011/0272394 | A1 | 11/2011 | Chun et al. |
| 2011/0290631 | A1 | 12/2011 | Kuriki |

(Continued)

FOREIGN PATENT DOCUMENTS

| CN | 101411255 A | 4/2009 |
|---|---|---|
| CN | 101683022 A | 3/2010 |

(Continued)

*Primary Examiner* — Adam R Giesy
(74) *Attorney, Agent, or Firm* — Dentons US LLP (57) ABSTRACT

The present invention relates to a conducting substrate and a touch screen comprising the same, and the conducting substrate according to the present invention comprises a board, an electric conducting pattern provided on at least one surface of the board, and a darkening layer provided on at least one surface of the electric conducting pattern and in a region corresponding to the electric conducting pattern, wherein a reflective diffraction intensity of a reflective diffraction image obtained by radiating light emitted from a point light source on one surface from which the darkening layer is visible is reduced by 60% or more as compared to the conducting substrate having the same constitution except that the electric conducting pattern is formed of Al and does not comprise the darkening layer.

29 Claims, 9 Drawing Sheets

(56) References Cited

U.S. PATENT DOCUMENTS

| | | |
|---|---|---|
| 2012/0187821 A1 | 7/2012 | Lee et al. |
| 2012/0295071 A1* | 11/2012 | Sato .................. G06F 3/041 428/188 |
| 2013/0028503 A1 | 1/2013 | Wakui et al. |
| 2013/0248239 A1 | 9/2013 | Lee et al. |

FOREIGN PATENT DOCUMENTS

| | | |
|---|---|---|
| JP | 11-150388 A | 6/1999 |
| JP | 1999-150388 | 6/1999 |
| JP | 2002-014772 | 1/2002 |
| JP | 2002-014772 A | 1/2002 |
| JP | 2002-108248 A | 4/2002 |
| JP | 2003-195356 A | 7/2003 |
| JP | 2007-155871 A | 6/2007 |
| JP | 2009-080288 | 4/2009 |
| JP | 2009-080288 A | 4/2009 |
| JP | 2010027391 A | 2/2010 |
| KR | 2009-0078235 | 7/2009 |
| KR | 10-2010-0122315 A | 11/2010 |
| KR | 2010-0122315 | 11/2010 |
| KR | 2010-0128388 | 12/2010 |
| KR | 10-2011-0007593 A | 1/2011 |
| WO | 2008108042 A1 | 9/2008 |
| WO | 2011008055 A9 | 1/2011 |

\* cited by examiner

<Comparative Example 1>

<Example 1>

CONDUCTIVE SUBSTRATE AND TOUCH SCREEN HAVING SAME

TECHNICAL FIELD

This application is a National Stage Entry of International Application No. PCT/KR2012/002283, filed Mar. 28, 2012, and claims the benefit of Korean Patent Application No. 10-2011-0027832 filed on Mar. 28, 2011, each of which are hereby incorporated by reference in their entirety for all purposes as if fully set forth herein.

The present invention relates to a conducting substrate and a touch screen comprising the same.

BACKGROUND ART

In general, a display device refers to monitors for a TV or a computer as a whole, and comprises a display diode forming an image and a case supporting the display diode.

Examples of the display diode may comprise a plasma display panel (PDP), a liquid crystal display (LCD), an electrophoretic display, a cathode-ray tube (CRT), an OLED display and the like. An RGB pixel pattern for implementing an image and an additional optical filter may be provided in the display diode.

Meanwhile, relating to a display device, as the spread of smart phones, tablet PCs, and IPTVs is accelerated, a demand for a touch function that uses human hands as a direct input device without a separate input device such as keyboards or remote controllers is growing. In addition, a multi-touch function for recognizing a specific point and taking notes is also required.

The touch screen that performs the aforementioned function may be classified into the following types according to a detection manner of a signal.

That is, there are a resistive type detecting a position pressed by pressure in a state where a direct voltage is applied through a change in current or voltage value, a capacitive type using capacitance coupling in a state where an alternating voltage is applied, an electromagnetic type detecting a selected position in a state where a magnetic field is applied as a change in voltage and the like.

Among them, the resistive type and capacitive type touch screens that are most extensively spread recognize the touch by a change in electric contact or capacitive by using the transparent conducting film such as the ITO film. However, since most of the transparent conducting films has high resistance of 150 ohm/square or more, sensitivity is reduced in enlargement, and when the touch screen is manufactured by using the same, there are a complexity that a patterning process of ITO and a patterning process of an electrode of a metal trace portion are sequentially performed by a process such as photolithography and a problem that a cost of an ITO film is rapidly increased as a size of a screen is increased, such that there are an increase in manufacturing cost and difficulty in application to enlargement while manufacturing is performed. In order to overcome this, currently, there is an effort to implement enlargement by using a metal pattern having the high conductivity. In the case where the metal pattern is used, the metal pattern is useful to area enlargement due to high conductivity of the metal, and is advantageous in view of yield and cost because the trace electrode and the image portion are formed simultaneously to reduce the number of processes.

However, in the case where the touch screen is constituted by using the metal pattern, additional optical phenomena occur due to structural properties different from those of a known ITO, one of them is a reflective diffraction phenomenon due to a point light source such as sunlight, and another is a moire phenomenon exhibited when a regularized metal pattern is used.

In this case, the reflective diffraction phenomenon means that when the point light source such as sunlight or interior LED radiates light on a surface where the metal pattern of the display is provided, in the case where the metal pattern is regular, a pattern is formed by forming diffraction by reflection of the point light source, reducing legibility of a user. The reflective diffraction phenomenon is being magnified as an optical property to be even more managed because adoption of lightweight and portable products is gradually increased in current displays to emphasize outdoor visibility and the like.

Separately, the moire phenomenon is a phenomenon where another type of interference pattern is formed due to an interference phenomenon between the pixel and the pattern of the display in the case where a regular pattern is present on a pixel pattern or an electrode pattern of the display, and this phenomenon reduces legibility and disturbs mixing of colors of the pixel to cause a problem of reducing an image quality of the display.

In the case of a plasma display panel (PDP) as an example thereof, in the case where a metal mesh pattern for blocking electromagnetic waves is introduced, a moire phenomenon may occur due to regularity of the pixel and the metal mesh pattern of the plasma display. Therefore, in order to solve this, in general, if the specification of the plasma display panel (PDP) is determined, an effort for solving the moire phenomenon is made through an angle design of a metal mesh pattern of an optical filter.

However, avoidance of the moire phenomenon through setting of the angle of the display pixel and the metal mesh pattern is cumbersome in that different patterns need to be used according to the size of the display and the pixel implementation manner.

DISCLOSURE

Technical Problem

The present invention has been made in an effort to develop a technology for improving performance of the aforementioned touch screen. Particularly, a pixel pattern has been more finely formed to implement high resolution in a recently extensively used LCD display panel, and different sizes and shapes of pixels are applied according to products for each manufacturer, such that it is more and more difficult to manufacture products by introducing one consistent moire avoidance design only by a known angle design of a mesh pattern.

Technical Solution

An exemplary embodiment of the present invention provides a conducting substrate, comprising: a board, an electric conducting pattern provided on at least one surface of the board, and a darkening layer provided on at least one surface of the electric conducting pattern and in a region corresponding to the electric conducting pattern, wherein a reflective diffraction intensity of a reflective diffraction image obtained by radiating light emitted from a point light source on one surface from which the darkening layer is visible is reduced by 60% or more as compared to the conducting substrate having the same constitution except that the electric conducting pattern is formed of Al and does not comprise the darkening layer.

Another exemplary embodiment of the present invention provides a conducting substrate, comprising: a board, an electric conducting pattern provided on at least one surface of the board, and a darkening layer provided on at least one surface of the electric conducting pattern and in a region corresponding to the electric conducting pattern, wherein total reflectance measured by using a total reflectance measuring device with an assumption of ambient light on one surface from which the darkening layer is visible is reduced by 20% or more as compared to the conducting substrate having the same constitution except that the electric conducting pattern is formed of Al and does not comprise the darkening layer.

Yet another exemplary embodiment of the present invention provides a touch screen, comprising: a conducting substrate comprising a board, an electric conducting pattern provided on at least one surface of the board, and a darkening layer provided on at least one surface of the electric conducting pattern and in a region corresponding to the electric conducting pattern, and an additional transparent board on a surface from which the darkening layer of the conducting substrate is visible, wherein a reflective diffraction intensity of a reflective diffraction image obtained by radiating light emitted from a point light source on one surface from which the darkening layer of the conducting substrate is visible is reduced by 60% or more as compared to the conducting substrate having the same constitution except that the electric conducting pattern is formed of Al and does not comprise the darkening layer.

Still another exemplary embodiment of the present invention provides a touch screen, comprising: a conducting substrate comprising a board, an electric conducting pattern provided on at least one surface of the board, and a darkening layer provided on at least one surface of the electric conducting pattern and in a region corresponding to the electric conducting pattern, and an additional transparent board on a surface from which the darkening layer of the conducting substrate is visible, wherein total reflectance measured by using a total reflectance measuring device with an assumption of ambient light on one surface from which the darkening layer of the conducting substrate is visible is reduced by 20% or more as compared to the conducting substrate having the same constitution except that the electric conducting pattern is formed of Al and does not comprise the darkening layer.

Still yet another exemplary embodiment of the present invention provides a display, comprising: the touch screen and a display module.

Advantageous Effects

The conducting substrate and the touch screen comprising the same according to the present invention may not block a view, have excellent conductivity, reduce a reflective diffraction phenomenon due to a point light source, and prevent a reduction in display image quality by a moire phenomenon. In addition, since the electric conducting pattern according to the present invention can be formed by various methods such as an indirect printing method, a photolithography method, a photography method, a method using a hard mask, or a sputtering method after a desired pattern is previously set, the process is easily performed and the cost is low.

BEST MODE

Hereinafter, the present invention will be described in detail.

The present invention has been made in an effort to primarily provide a method for minimizing a reflective diffraction phenomenon due to a point light source in the case where a regularized pattern is used and an evaluation method and criteria of the reflective diffraction phenomenon in order to use the method in a display in practice, and further provide a pattern design method for basically solving the aforementioned moire phenomenon, and a conductor comprising the same and a touch screen comprising the same.

In the case where a transparent entire surface conducting layer is formed like a known technology (ITO and the like), there is a problem in that resistance is excessively increased in proportion to transmittance. In addition, in the case where, like the grid method or linear method, the electric conducting pattern that is formed of one or more kind of regular pattern is comprised in a regular internal structure, for example, a display that has a pixel structure, an optical film that has a regular pattern structure, or a display that comprises an electrode structure, because of the light source that is adjacent to the pattern structures, a relative interference between the patterns occurs, such that a moire phenomenon occurs, and if this moire phenomenon occurs, a visible recognizing property (visibility) is reduced.

Figure 1:
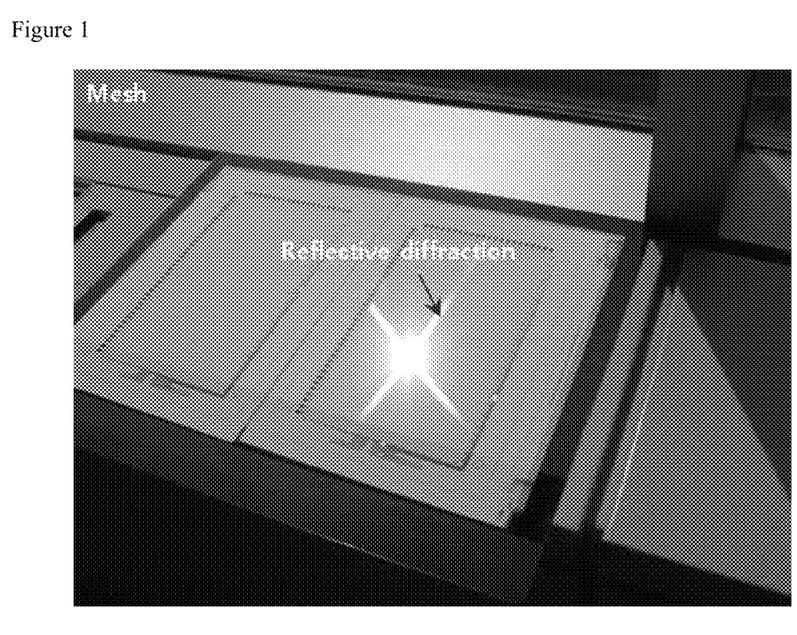
FIG. 1 is a view illustrating a reflective diffraction phenomenon of a known touch screen.

Further, in the case where the display has the optical film or the electrode structure having the regular pattern, in the case where external light is a point light source when they are provided in the display, diffraction may occur due to regularity of the pattern. Accordingly, in order to solve this, in the present invention, primarily, in the case of the reflective diffraction phenomenon, the intensity of reflective diffraction phenomenon significantly depends on the reflectance of the metal itself. Accordingly, as a method of reducing the reflective diffraction phenomenon of the metal, in the present invention, the darkening layer is introduced to the surface corresponding to the conducting pattern in order to reduce the reflectance of the conducting pattern and improve a light absorbance property. The following FIG. 1 illustrates a reflective diffraction phenomenon of a known touch screen comprising a mesh pattern when a point light source such as sunlight exists.

The conducting substrate according to the present invention comprises a board, an electric conducting pattern provided on at least one surface of the board, and a darkening layer provided on at least one surface of the electric conducting pattern and in a region corresponding to the electric conducting pattern.

An exemplary embodiment of the present invention provides a conducting substrate that comprises a board, an electric conducting pattern provided on at least one surface of the board, and a darkening layer provided on at least one surface of the electric conducting pattern and in a region corresponding to the electric conducting pattern, wherein a reflective diffraction intensity of a reflective diffraction image obtained by radiating light emitted from a point light source on one surface from which the darkening layer is visible is reduced by 60% or more as compared to the conducting substrate having the same constitution except that the electric conducting pattern is formed of Al and does not comprise the darkening layer.

In the conducting substrate according to the present invention, the reflective diffraction intensity may be reduced by 60% or more, 70% or more, and 80% or more as compared to the conducting substrate having the same constitution except that the electric conducting pattern is formed of Al and does not comprise the darkening layer. For example, the reflective diffraction intensity may be reduced by 60 to 70%, 70 to 80%, and 80 to 85%.

Another exemplary embodiment of the present invention provides a conducting substrate that comprises a board, an electric conducting pattern provided on at least one surface of the board, and a darkening layer provided on at least one surface of the electric conducting pattern and in a region corresponding to the electric conducting pattern, wherein total reflectance measured by using a total reflectance measuring device with an assumption of ambient light on one surface from which the darkening layer is visible is reduced by 20% or more as compared to the conducting substrate having the same constitution except that the electric conducting pattern is formed of Al and does not comprise the darkening layer.

In the conducting substrate according to the present invention, the total reflectance may be reduced by 20% or more, 25% or more, and 30% or more as compared to the conducting substrate having the same constitution except that the electric conducting pattern is formed of Al and does not comprise the darkened layer. For example, the total reflectance may be reduced by 25 to 50%.

Further, in the present invention, a transparent board may be additionally comprised in the surface from which the darkening layer of the electric conducting substrate is visible.

Another exemplary embodiment of the present invention provides a touch screen that comprises a conducting substrate comprising a board, an electric conducting pattern provided on at least one surface of the board, and a darkening layer provided on at least one surface of the electric conducting pattern and in a region corresponding to the electric conducting pattern, and an additional transparent board on a surface from which the darkening layer of the conducting substrate is visible, wherein a reflective diffraction intensity of a reflective diffraction image obtained by radiating light emitted from a point light source on one surface from which the darkening layer of the conducting substrate is visible is reduced by 60% or more as compared to the conducting substrate having the same constitution except that the electric conducting pattern is formed of Al and does not comprise the darkening layer.

Another exemplary embodiment of the present invention provides a touch screen that comprises a conducting substrate comprising a board, an electric conducting pattern provided on at least one surface of the board, and a darkening layer provided on at least one surface of the electric conducting pattern and in a region corresponding to the electric conducting pattern, and an additional transparent board on a surface from which the darkening layer of the conducting substrate is visible, wherein total reflectance measured by using a total reflectance measuring device with an assumption of ambient light on one surface from which the darkening layer of the conducting substrate is visible is reduced by 20% or more as compared to the conducting substrate having the same constitution except that the electric conducting pattern is formed of Al and does not comprise the darkening layer.

In the touch screen according to the present invention, examples of the additional transparent board may comprise reinforced glass, transparent plastic and the like, but are not limited thereto.

In the present invention, the darkening layer may be provided on an upper surface and a lower surface of the electric conducting pattern, provided on at least a portion of a lateral surface as well as the upper surface and lower surface of the electric conducting pattern, and provided on the upper surface, the lower surface and the entire lateral surface of the electric conducting pattern.

In the present invention, the darkening layer may be provided on the entire surface of the electric conducting pattern to reduce visibility according to high reflectance of the electric conducting pattern. In this case, when the darkening layer is bonded to a layer having high reflectance such as the conducting layer, since the darkening layer has destructive interference and self-light absorbance under a specific thickness condition, an effect of reducing the reflectance by the conducting pattern by similarly adjusting quantities of light reflecting on the darkening layer and light reflecting on the conducting pattern through the darkening layer is exhibited and, at the same time, guiding destructive interference between two lights under the specific thickness condition.

In this case, in the color range of the pattern region formed of the darkening layer and the electric conducting pattern, which is measured from the surface from which the darkening layer of the conducting substrate is visible, an L value may be 20 or less, an A value may be −10 to 10, and a B value may be −70 to 70, the L value may be 10 or less, the A value may be −5 to 5, and the B value may be 0 to 35, or the L value may be 5 or less, the A value may be −2 to 2, and the B value may be 0 to 15 based on a CIE LAB color coordinate.

Further, the total reflectance of the pattern region formed of the darkening layer and the electric conducting pattern, which is measured from the surface from which the darkening layer of the conducting substrate according to the present invention is visible, may be 17% or less, 10% or less, or 5% or less based on external light of 550 nm.

Figure 2:
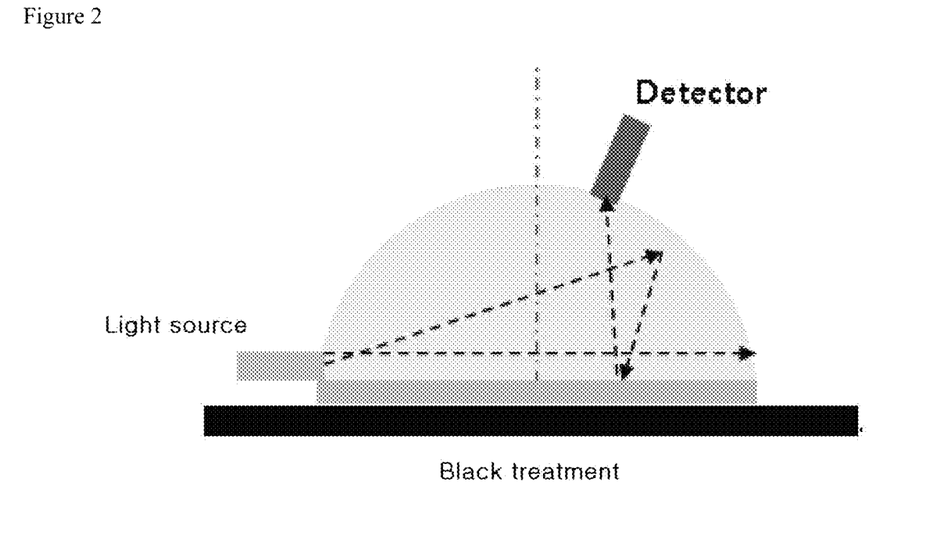
FIG. 2 is a view illustrating constitution of a device for measuring total reflectance of the conducting substrate according to an exemplary embodiment of the present invention.
Figure 3:
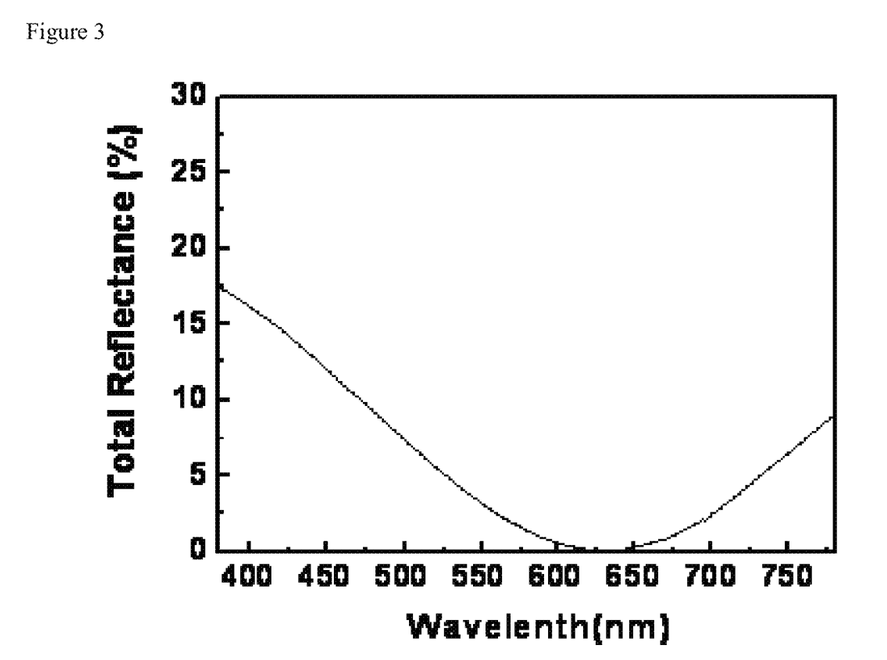
FIG. 3 is a view illustrating a graph of the total reflectance of the conducting substrate according to the exemplary embodiment of the present invention.

Herein, the total reflectance means reflectance obtained in consideration of both diffuse reflectance and specular reflectance. The total reflectance is a value observed by setting the reflectance of an opposite surface of the surface to be measured in reflectance by using a black paste, a tape or the like to 0 and then measuring only the reflectance of the surface to be measured, and in this case, a diffuse light source that is most similar to the ambient light condition is introduced as the provided light source. Further, in this case, the measurement position of the reflectance is set based on a position that is inclined at about 7° from a vertical line of a hemisphere of an integrating sphere. The following FIG. 2 illustrates constitution of a device for measuring total reflectance, and the following FIG. 3 illustrates a graph of the total reflectance of the conducting substrate according to the exemplary embodiment of the present invention.

The conducting substrate comprising the electric conducting pattern and the darkening layer may form the electric conducting layer and the darkening layer by using a deposition method, for example, a method such as a sputtering method, a CVD (chemical vapor deposition) method, a thermal evaporation method, and an e-beam deposition method, and the electric conducting layer and the darkening layer may be patterned to form an electric conducting pattern and the darkening layer. In particular, in the case where the sputtering method is used, a flexible property of the darkening layer is excellent. In the thermal evaporation method and e-beam deposition method, particles are simply stacked, but the sputtering method is characterized in that particles form a nucleus by collision and even though the nucleus grows and is bent, mechanical properties are excellent. In addition, in the case where the sputtering method is used, an interface attachment ability between the darkening layer and the other layer is excellent. By using the deposition method as described above, without using an adhesive layer or attachment layer, the darkening pattern may be directly formed on the board or electric conducting pattern, and a desired thickness and pattern shape may be implemented.

In the present invention, the darkening layer and electric conducting pattern may be patterned simultaneously or separately, but layers for forming each pattern are separately formed. However, it is most preferable to form the electric conducting pattern and the darkening layer simultaneously in order to allow the electric conducting pattern and the darkening layer to be present on the precisely corresponding surfaces.

By forming the pattern as described above, while an effect of the darkening layer itself is optimized and maximized, it is possible to implement a fine electric conducting pattern required in a touch screen. In the touch screen, in the case where the fine electric conducting pattern is not implemented, physical properties required in the touch screen, such as resistance cannot be obtained.

In the present invention, since the darkening layer and electric conducting pattern form a laminate structure by a separate pattern layer, the structure is different from a structure in which at least a portion of a light absorption material is recessed or dispersed in an electric conducting pattern, or a structure in which a portion of a surface is physically or chemically deformed by performing surface treatment on a conducting layer of a single layer.

In addition, in the touch screen according to the present invention, the darkening layer is directly provided on the board or electric conducting pattern while an attachment layer or adhesive layer is not disposed therebetween. The attachment layer or adhesive layer may affect durability or optical properties. In addition, a method for manufacturing the laminate comprised in the touch screen according to the present invention is largely different from the case where the attachment layer or adhesive layer is used. Moreover, as compared to the case where the attachment layer or adhesive layer is used, in the present invention, interface properties between the board or electric conducting pattern and the darkening layer are excellent.

In the present invention, any thickness may be used as long as the darkening layer has destructive interference property and absorption coefficient property which are the aforementioned physical properties and the thickness of the darkening layer satisfies the thickness condition of $\lambda/(4\times n)=N$ (herein, N is an odd number) when the wavelength of light is set by $\lambda$, and the refractive index of the darkening layer is defined by n. However, during the manufacturing process, in consideration of an etching property with the electric conducting pattern, it is preferable that the thickness is selected from 10 nm to 400 nm, but the preferable thickness may be different according to the used material and the manufacturing process, and the scope of the present invention is not limited to the above numerical range.

The darkening layer may be formed of a single layer, or a plurality of layers of two or more layers.

It is preferable that the darkening layer have a color that is close to an achromatic color. However, the color is not necessary to be the achromatic color, and the darkening layer may be introduced as long as the reflectance is low even though the darkening layer has a color. In this case, the achromatic color means a color exhibited when light that is incident on a surface of a body is not selectively absorbed but evenly reflected and absorbed with respect to a wavelength of each component. In the present invention, the darkening pattern may use a material having a standard deviation of total reflectance for each wavelength of 50% or less in a visible ray region (400 to 800 nm) when the total reflectance is measured.

The material of the darkening layer is a light absorbing material, and preferably may use any materials without a particular limitation as long as the material is made of metal, metal oxide, metal nitride or metal oxynitride having the aforementioned physical properties when the entire surface layer is formed.

For example, the darkening layer may be an oxide film, a nitride film, an oxide-nitride film, a carbide film, a metal film and a combination thereof formed by using Ni, Mo, Ti, Cr, and the like under a deposition condition set by the person with ordinary skill. The present inventors confirmed that in the case where Mo is used, the case where nitrides are used together with oxides has an optical property more suitable for the darkening pattern mentioned in the present invention as compared to the case where oxides are used alone.

As a detailed example thereof, the darkening layer may comprise both Ni and Mo. The darkening pattern may comprise 50 to 98 atom % of Ni and 2 to 50 atom % of Mo, and may further comprise 0.01 to 10 atom % of other metals, for example, atoms such as Fe, Ta, and Ti. Herein, the darkening pattern, if necessary, may further comprise 0.01 to 30 atom % of nitrogen or 4 atom % or less of oxygen and carbon.

As another detailed example thereof, the darkening layer may comprise a dielectric material selected from SiO, $SiO_2$, $MgF_2$ and $SiN_x$ (x is an integer of 1 or more) and a metal selected from Fe, Co, Ti, V, Al, Cu, Au and Ag, and may further comprise an alloy of two or more kinds of metals selected from Fe, Co, Ti, V, Al, Cu, Au and Ag. It is preferable that the dielectric material is distributed to be gradually decreased in an amount as the dielectric material moves farther from an incident direction of external light, and the metal and alloy component are distributed on the contrary. In this case, it is preferable that the content of the dielectric material is 20 to 50 wt % and the content of the metal is 50 to 80 wt %. In the case where the darkening pattern further comprises the alloy, it is preferable that the darkening pattern comprises 10 to 30 wt % of the dielectric material, 50 to 80 wt % of the metal, and 5 to 40 wt % of the alloy.

As another detailed example thereof, the darkening layer may be formed of a thin film comprising an alloy of nickel and vanadium, and one or more oxide, nitride, oxynitride of nickel and vanadium. In this case, it is preferable that vanadium is comprised in a content of 26 to 52 atom %, and it is preferable that an atomic ratio of vanadium to nickel is 26/74 to 52/48.

As another detailed example thereof, the darkening layer may comprise a transition layer in which two or more elements are comprised and a composition ratio of one element is increased by about a maximum of 20% per 100 angstrom according to an incident direction of external light. In this case, one element may be a metal element such as chrome, tungsten, tantalum, titanium, iron, nickel or molybdenum, and an element other than the metal element may be oxygen, nitrogen or carbon.

As another detailed example thereof, the darkening layer may comprise a first chrome oxide layer, a metal layer, a second chrome oxide layer and a chrome mirror, and in this case, may comprise metal selected from tungsten, vanadium, iron, chrome, molybdenum and niobium instead of chrome. The metal layer may have a thickness of 10 to 30 nm, the first chrome oxide layer may have a thickness of 35 to 41 nm, and the second chrome oxide layer may have a thickness of 37 to 42 nm.

As another detailed example thereof, a laminate structure of an alumina ($Al_2O_3$) layer, a chrome oxide ($Cr_2O_3$) layer and a chrome (Cr) layer may be used as the darkening layer. Herein, the alumina layer has properties of improving a reflection property and preventing light diffusion, and the chrome oxide layer may improve a contrast property by decreasing inclined surface reflectance.

In the present invention, the darkening layer is provided in a region corresponding to the electric conducting pattern. Herein, the region corresponding to the electric conducting pattern means that the region has the pattern having the same shape as the electric conducting pattern. However, the pattern size of the darkening layer does not need to be completely identical to the electric conducting pattern, and the case where the line width of the darkening layer is narrower or wider as compared to the line width of the electric conducting pattern is comprised in the scope of the present invention. For example, it is preferable that the darkening layer have an area of 80 to 120% of an area in which the electric conducting pattern is provided.

It is preferable that the darkening layer have a pattern shape having the same line width as or larger line width than the electric conducting pattern.

In the case where the darkening layer has the pattern shape having the larger line width than that of the electric conducting pattern, since an effect in which the darkening layer covers the electric conducting pattern when observed by the user may be enlarged, there is an advantage in that an effect by gloss or reflection of the electric conducting pattern itself may be efficiently blocked. However, even though the line width of the darkening layer is the same as the line width of the electric conducting pattern, a target effect of the present invention can be accomplished. It is preferable that the line width of the darkening layer is larger than the line width of the electric conducting pattern by a value according to the following Equation 1.

$$Tcon \times \tangent \Theta_3 \times 2 \quad \text{[Equation 1]}$$

In Equation 1,

Tcon is a thickness of the conducting pattern, and $\Theta_3$ is an angle between light and a tangential line with respect to the surface of the board when light that is incident from a position of the vision of the user of the touch screen passes through the corners of the conducting pattern and the darkening pattern.

$\Theta_3$ is an angle obtained by modifying an angle ($\Theta_1$) between the vision of the user of the touch screen and the board by a refractive index of the board and a refractive index of a medium of a region in which the darkening pattern and the conducting pattern are disposed, for example, an adhesive of the touch screen according to Snell's law.

For example, assuming that an observer observes the laminate so that the value of $\Theta_3$ forms an angle of about 80° and the thickness of the conducting pattern is about 200 nm, it is preferable that the line width of the darkening pattern is larger than that of the conducting pattern by about 2.24 μm (200 nm×tan(80)×2) based on the lateral surface. However, as described above, even in the case where the darkening pattern has the same line width as the conducting pattern, a target effect of the present invention can be achieved.

In the present invention, specific resistance of the darkening layer may be $1 \times 10^2$ to $5 \times 10^2$ Ω·cm, but is not limited thereto. In addition, the transmittance of the darkening layer may be 35 to 60%, but is not limited thereto.

Figure 4:
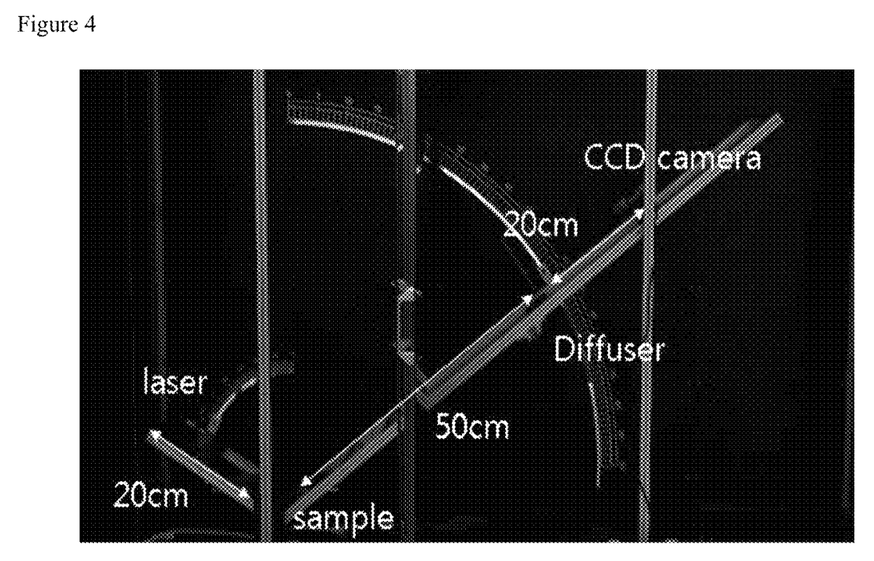
FIG. 4 is a view illustrating a reflective diffraction device for evaluating light properties of the conducting substrate according to the exemplary embodiment of the present invention.

In the present invention, the constitution of the device shown in the following FIG. 4 is introduced in order to evaluate optical properties of the conducting substrate comprising the electric conducting pattern and the darkening layer according to the present invention.

In the present invention, the reflective diffraction device of the following FIG. 4 was introduced in order to evaluate the reflective diffraction property. The constitution of the reflective diffraction device is described in the following Table 1.

TABLE 1

| Division | | |
|---|---|---|
| Laser | Bare Model | A1 250 SL-532 nm-GLM-0.12 (cross line) |
| | Wavelength | 532 nm |
| Diffuser | Size | 200 mm × 200 mm |
| | Note | Polishing using the bead having the size of about 1200/inch² |
| CCD | Model | AM413ZT Dino-Lite |

In this case, the device was constituted so that light reflecting on the sample was detected by identically forming the angle at which the laser is incident and the angle at which the laser reflects. In this case, the used laser source was a single light source having a wavelength of 532 nm. This is because in the case where light having the mixed color is used instead of light having the single color, there is a problem in that diffraction properties are differently exhibited according to the wavelength and the different diffraction properties overlap with each other to make a desired observation difficult. Furthermore, in the present invention, a diffuser was introduced in order to form an image of light emitted from the laser light source and reflecting on the sample, and the diffuser was manufactured by polishing beads having the size of about 500 μm. This is because in the case of a general transparent glass, since there is no phenomenon of formation of the image, it is difficult to obtain the image, but in the case of a completely opaque board, an observation position of the image is complicated. Finally, in the present invention, data of the reflective diffraction image are obtained by positioning a camera on an opposite surface of the diffuser. After the image size of the image data obtained by this method was changed into 256× 256 through a general image software, the intensity to the reflective diffraction was subjected to compilation for statistics through a software that is called Scion image.

Figure 5:
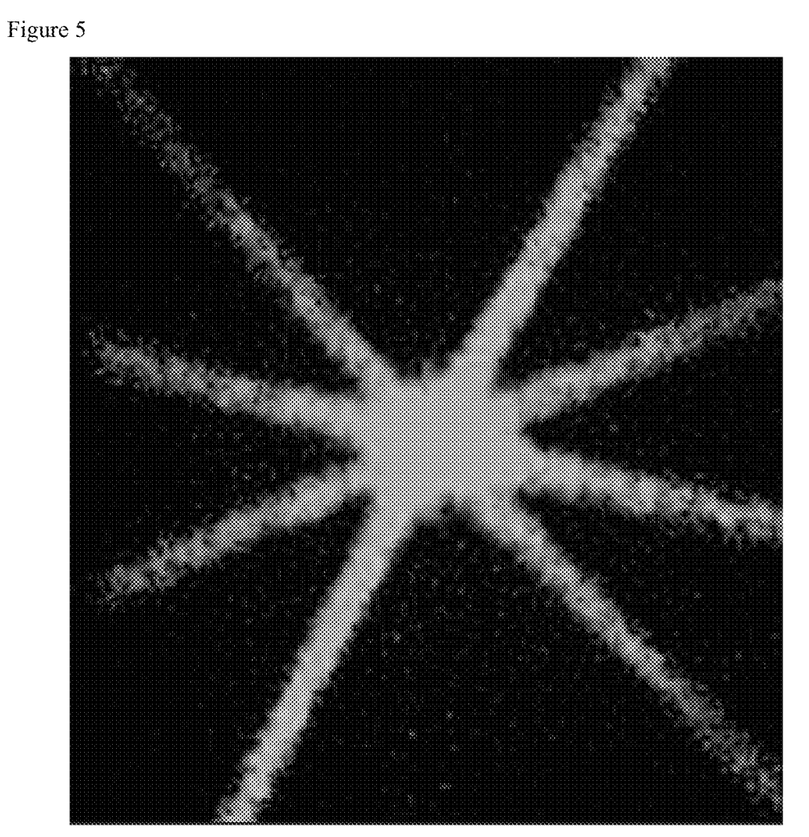
FIG. 5 is a view illustrating a reflective diffraction image of a known conducting substrate.
Figure 6:
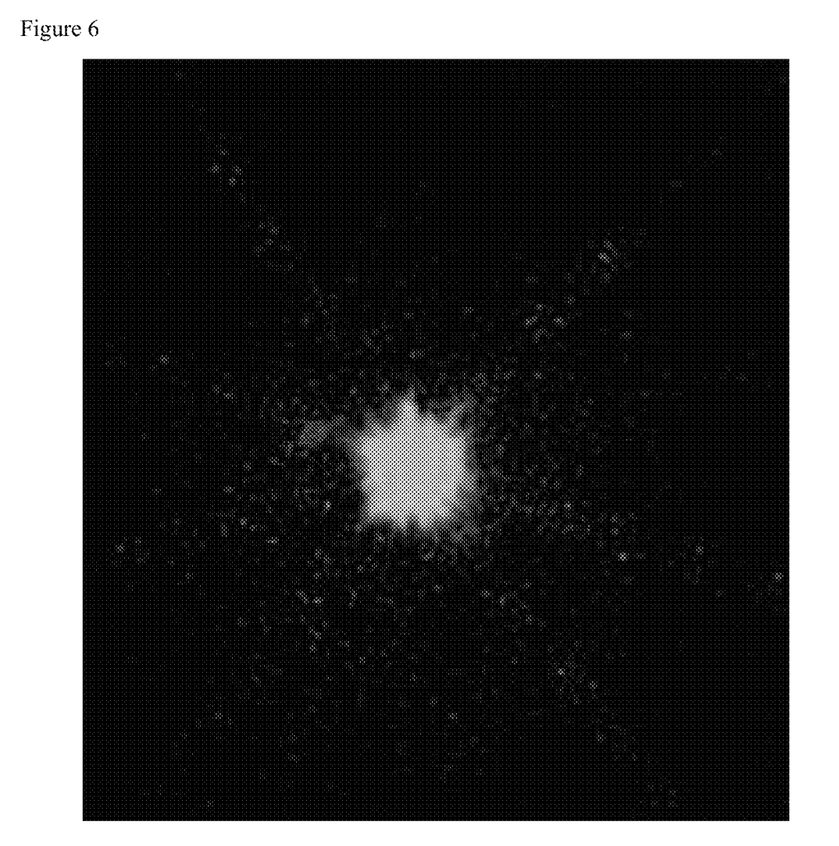
FIG. 6 is a view illustrating a reflective diffraction image of the conducting substrate according to the exemplary embodiment of the present invention.

The following FIG. 5 illustrates a reflective diffraction image of a known conducting substrate not comprising the darkening layer, and the following FIG. 6 illustrates a reflective diffraction image of the conducting substrate according to the exemplary embodiment of the present invention.

In the present invention, the material of the electric conducting pattern is not particularly limited, but the metal is preferable. It is preferable that the material of the electric conducting pattern has excellent conductivity and can be easily etched.

In general, the material having excellent conductivity has a disadvantage in that reflectance is high. However, in the present invention, it is possible to form the electric conducting pattern using the material having high reflectance by using the darkening layer. In the present invention, even though the material having the total reflectance of 70 to 80% or more is used, it is possible to decrease the total reflectance, decrease visibility of the electric conducting pattern, and maintain or improve a contrast property through the darkening layer.

It is preferable that detailed examples of the material of the electric conducting pattern comprise a single film or a multilayered film comprising gold, silver, aluminum, copper, neodymium, molybdenum, nickel, or an alloy thereof. Herein, the thickness of the electric conducting pattern is not particularly limited, but is preferably 0.01 to 10 µm in terms of conductivity of the electric conducting pattern and economic efficiency of the forming process thereof.

The patterning of the laminate formed of the electric conducting pattern and the darkening layer may use a method using an etching resist pattern. The etching resist pattern may be formed by using a printing method, a photolithography method, a photography method, a method using a mask, or a laser transferring, for example, a thermal transfer imaging, and the printing method or photolithography method is more preferable. The electric conducting pattern may be etched and the etching resist pattern may be removed by using the etching resist pattern.

In the present invention, the line width of the electric conducting pattern may be 10 µm or less, 0.1 to 10 µm, 0.2 to 8 µm and 1 µm or more and 5 µm or less. The thickness of the conducting pattern may be 10 µm or less, 2 µm or less, and 10 to 300 nm.

In the present invention, the electric conducting pattern is a regular pattern and comprises cross points formed by crossing a plurality of predetermined lines among lines constituting the conducting pattern, and the number of cross points may be 3,000 to 123,000, 5,000 to 35,000, and 10,000 to 35,000 in an area of 3.5 cm×3.5 cm.

The opening ratio of the electric conducting pattern, that is, the ratio of the area not covered by the pattern, may be 70% or more, 85% or more, and 95% or more. In addition, the opening ratio of the electric conducting pattern may be 90 to 99.9%, but is not limited thereto.

The conducting pattern may be a regular pattern, and a pattern type of the art, such as a mesh pattern, may be used as the regular pattern.

The pitch of the conducting pattern may be 600 µm or less and 250 µm or less, but this may be adjusted according to transmittance and conductivity required by the person with ordinary skill in the art.

The electric conducting pattern used in the present invention is appropriately a material having specific resistance of $1 \times 10^6$ to $30 \times 10^6$ ohm·cm, and more preferably $7 \times 10^6$ ohm·cm or less.

In the present invention, surface resistance of the conducting substrate may be 1 to 300 ohm/square. The matter within the aforementioned range is advantageous in operating the touch screen.

In the present invention, lateral surfaces of the darkening layer and the electric conducting pattern may have a positive taper angle, but the darkening layer or the conducting pattern positioned on an opposite surface of a board side of the conducting pattern may have a negative taper angle.

The touch screen according to the present invention may further comprise a conducting substrate comprising an additional darkening layer in addition to the aforementioned conducting substrate comprising the board, the electric conducting pattern and the darkening layer. In this case, the conducting substrates comprising the darkening layer may be disposed in different directions with the electric conducting pattern as the center. Two or more conducting substrates that may be comprised in the touch screen of the present invention and comprise the darkening layer do not need to have the same structure, and only any one and preferably the conducting substrate of a side that is closest to the user may comprise the board, the electric conducting pattern, and the darkening layer, and the additionally comprised conducting substrate may not comprise the darkening layer.

In addition, in the touch screen according to the present invention, the electric conducting pattern and the darkening layer may be provided on both surfaces of the board.

The touch screen according to the present invention may further comprise an electrode portion or a pad portion in addition to an effective screen portion where the electric conducting pattern is formed on the conducting substrate, and in this case, the effective screen portion and the electrode portion/pad portion may be constituted by the same conductor and have the same thickness, such that there may be no joints therein.

The touch screen according to the present invention may be provided with a protection film, a polarizing film, an antireflection film, an antiglare film, a fingerprint-resistant film, a low reflection film or the like on one surface of each board.

The opening ratio of the touch screen according to the present invention, that is, the ratio of the area not covered by the pattern, may be 70% or more, 85% or more, and 95% or more. In addition, the opening ratio of the touch screen may be 90 to 99.9%, but is not limited thereto.

In addition, the present invention provides a method of manufacturing a touch screen.

According to an exemplary embodiment, the present invention provides a method of manufacturing a touch screen, which comprises forming an electric conducting pattern on a board; and forming a darkening layer on the electric conducting pattern.

According to another exemplary embodiment, there is provided a method of manufacturing a touch screen, which comprises forming a conducting layer for forming a conducting pattern on a board; depositing a darkening layer on the conducting layer; and separately or simultaneously patterning the conducting layer and the darkening layer.

In the manufacturing method, the material and forming method of the above each layer may be used.

Further, the touch screen according to the present invention comprises the conducting substrate. For example, the conducting substrate according to the exemplary embodiment of the present invention may be used as a touch-sensitive type electrode substrate in a capacitive type touch screen.

The touch screen according to the exemplary embodiment of the present invention may comprise a lower board; an upper board; and an electrode layer provided on any one surface of a surface of the lower board that is in contact with the upper board and a surface of the upper board that is in contact with the lower board or both the surfaces. The electrode layer may perform functions of transmission and receiving of signals to detect the X axis and Y axis positions.

In this case, one or two of the electrode layer provided on the lower board and the surface of the lower board that is in contact with the upper board; and the electrode layer provided on the upper board and the surface of the upper board that is in contact with the lower board may be the conducting substrate according to the exemplary embodiment of the present invention. In the case where only any one of the electrode layers is the conducting substrate according to the present invention, the other one may have the pattern known in the art.

In the case where the electrode layer is provided on one surface of each of both the upper board and the lower board to form two electrode layers, an insulation layer or a spacer may be provided between the lower board and the upper board so as to constantly maintain an interval between the electrode layers and prevent connection therebetween. The insulation layer may comprise an adhesive or a UV or heat curable resin.

The touch screen may further comprise a ground portion that is connected to the electric conducting pattern as described above. For example, the ground portion may be formed at an edge portion of the surface on which the electric conducting pattern of the board is formed. At least one of an antireflection film, a polarizing film, and a fingerprint resistant film may be provided on at least one surface of the laminate comprising the conducting substrate. Other kinds of functional films may be further comprised in addition to the aforementioned functional films according to the design specification. The touch screen may be applied to a display device such as an OLED display panel (PDP), a liquid crystal display (LCD), a cathode-ray tube (CRT), and a PDP.

In addition, the present invention provides a display comprising the touch screen and a display module.

[Mode for Invention]

A better understanding of the present invention may be obtained in light of the following Examples which are set forth to illustrate, but are not to be construed to limit the present invention.

EXAMPLE

Comparative Example 1

After the conducting mesh pattern having the pitch of (250 μm) and the line width of (4 μm) was formed by pure Al on the PET substrate, the two substrates were mounted on the display by lamination to confirm the angle at which the image quality of the display was not mainly distorted, and the two conducting substrates were laminated through the OCA (optically clear adhesive). The touch screen was manufactured by attaching this to reinforced glass again.

Example 1

The conducting layer and the darkening layer were formed by further forming oxynitrides by using the Mo target on the board on which Cu was deposited on the entire surface thereof by the sputter device, and the thickness of the final laminate was 220 nm. The reflectance of the board obtained by measuring this on the darkening surface corresponded to 6.1%. The etching resist (developed by LGC itself) was printed by using the formed board by using the reverse offset process, fired at 120° C. for 3 min, and etched by using the Cu etchant manufactured by ENF, Co., Ltd. at 40° C. for 40 sec. Thereafter, the line width of the pattern measured after being stripped with acetone was 3.5 μm.

Experimental Example

1) Evaluation of Reflective Diffraction Property

The evaluation of the reflective diffraction property was performed by using the device of the following FIG. 4 so that the laser light source was incident on the surface of reinforced glass. The image of the reflective diffraction of Comparative Example 1 was illustrated in the following FIG. 5, and the image of the reflective diffraction of Example 1 was illustrated in the following FIG. 6.

As a result, as compared to Comparative Example 1, it could be confirmed that the intensity of reflective diffraction of Example 1 according to the present invention was shown even weakly. Further, the average intensity analyzed through the software was 27.8 in the case of Comparative Example 1 and about 6.09 in the case of Example 1, and it could be confirmed that the intensity of the reflective diffraction of the conducting substrate according to the present invention was about 22 % as compared to the conducting substrate having the same constitution except that the electric conducting pattern was formed of Al and did not comprise the darkening layer. Accordingly, it could be confirmed that the conducting substrate according to the present invention exhibited the reduction effect of the reflective diffraction of about 78% as compared to the conducting substrate having the same constitution except that the electric conducting pattern was formed of Al and did not comprise the darkening layer.

In the present invention, in order to additionally confirm the critical value at which legibility of the display by the user was not reduced any more by the intensity of reflective diffraction image, measurement using the device was performed by controlling the intensity of reflective diffraction image while the darkening level was changed, thereby confirming the critical value at which legibility by the user was not reduced any more. As a result, as compared to the conducting substrate having the same constitution except that the electric conducting pattern was formed of Al and did not comprise the darkening layer, in the case where the intensity of reflective diffraction of the conducting substrate according to the present invention was reduced by about 60% or more, it could be obtained the evaluation result that there was no big problem in legibility.

2) Evaluation by the Naked Eye

Figure 7:
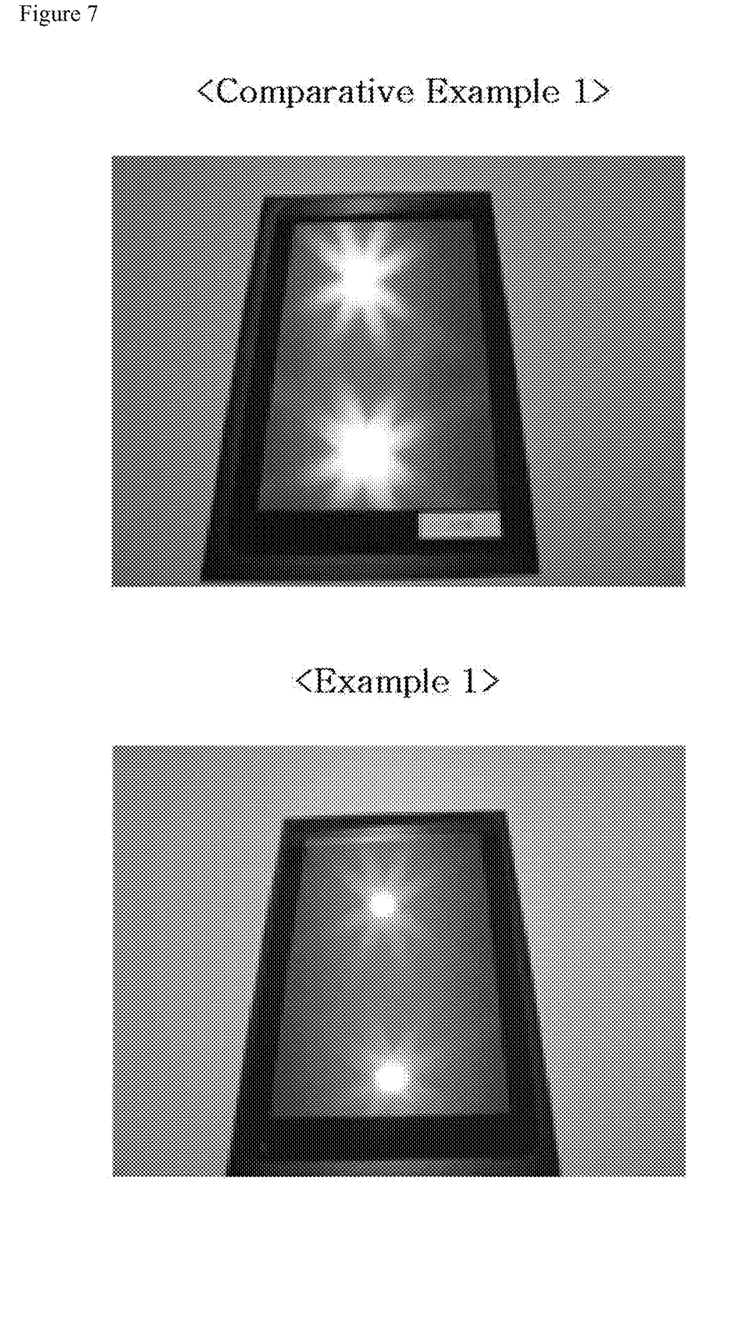
FIG. 7 is a view obtained by observing a reflective diffraction property of the touch screen according to the exemplary embodiment of the present invention by the naked eye.

In order to confirm conformity between the aforementioned evaluation result of the reflective diffraction property and the actual reflective diffraction, the touch screens of Example 1 and Comparative Example 1 were shone by the internal point light source and observed by the naked eye, and the results are illustrated in the following FIG. 7. Accordingly, it could be confirmed that the evaluation result of the actual sample by the naked eye and the evaluation result of the actual sample by the analysis device were exactly the same with each other.

3) Evaluation of Total Reflectance Property

The touch screens of Example 1 and Comparative Example 1 were manufactured to have the pitch of 300 μm and 250 μm, respectively, and the total reflectance was measured under the ambient light condition. As a result, the measurement result of total reflectance to the touch screen having the pitch of 300 μm was shown in the following FIG. 8, and the measurement result of total reflectance to the touch screen having the pitch of 250 μm was shown in the following FIG. 9.

Figure 8:
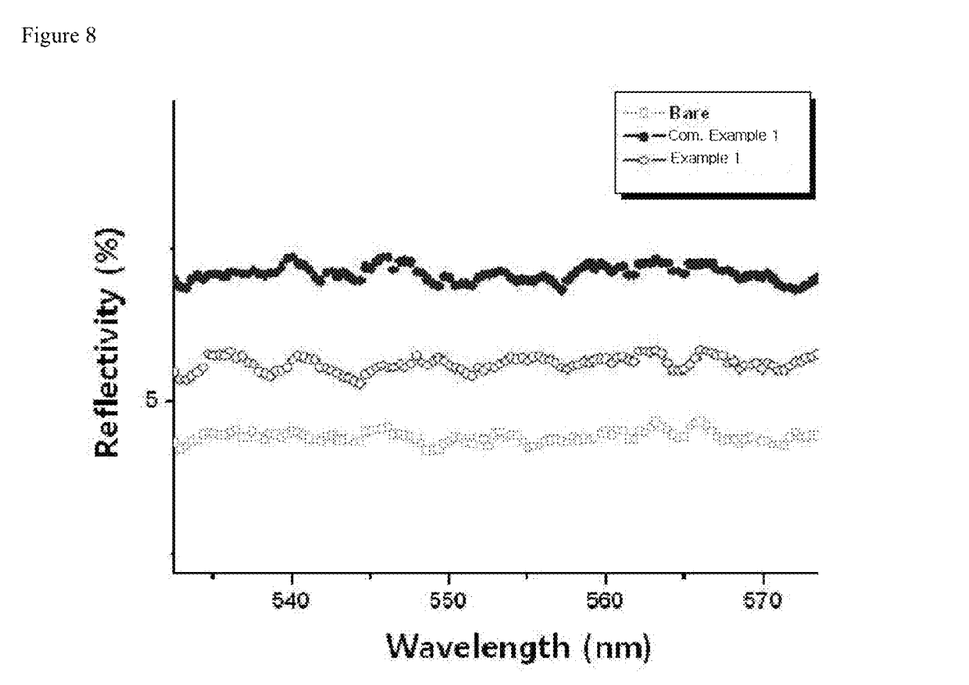
FIGS. 8 and 9 are views illustrating results of measurement of total reflectance of the touch screen according to the exemplary embodiment of the present invention.
Figure 9:
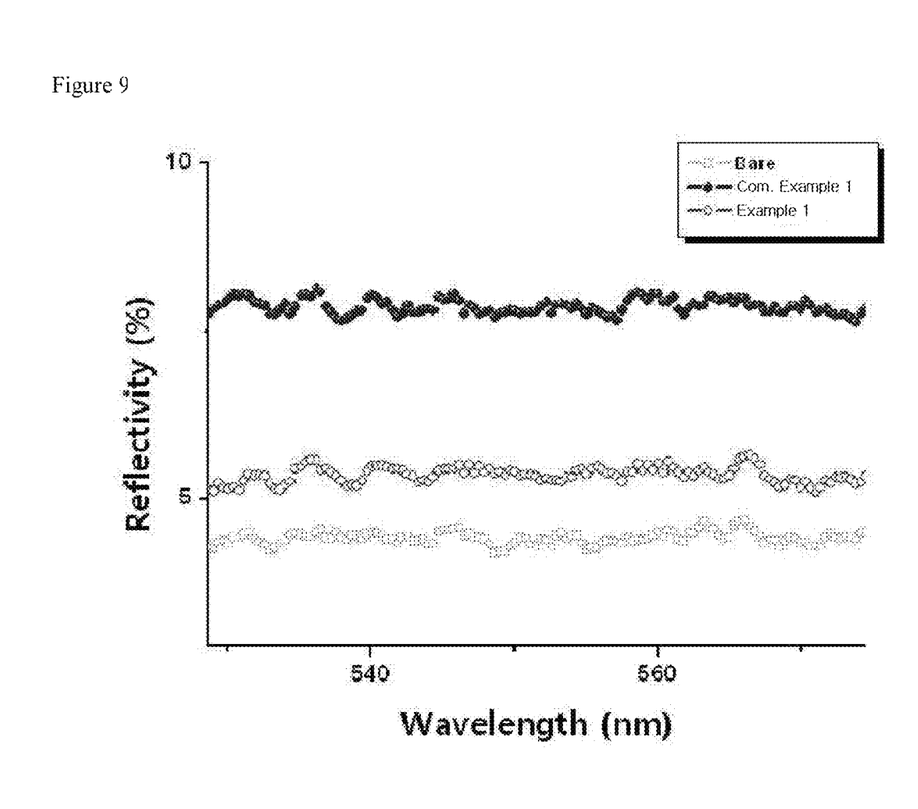

As shown in the results of the following FIGS. 8 and 9, it could be confirmed that the touch screen of the present invention had even lower total reflectance as compared to the touch screen constituted by pure Al regardless of the pitch of the touch screen and the reduction effect of total reflectance by 20% or more was exhibited in the case where the touch screen was constituted by pure Al.

As described above, the conducting substrate and the touch screen comprising the same according to the present invention may not block a view, have excellent conductivity, reduce a reflective diffraction phenomenon by a point light source, and prevent a reduction in display image quality by a moire phenomenon.

The invention claimed is:

1. A conducting substrate comprising:
a board,
an electric conducting pattern provided on at least one surface of the board, and
a darkening layer provided on at least one surface of the electric conducting pattern and in a region corresponding to the electric conducting pattern,
wherein a reflective diffraction intensity of a reflective diffraction image obtained by radiating light emitted from a point light source on one surface from which the darkening layer is visible is reduced by 60% or more as compared to the conducting substrate having the same constitution except that the electric conducting pattern is formed of Al and does not comprise the darkening layer.

2. A conducting substrate comprising:
a board,
an electric conducting pattern provided on at least one surface of the board, and
a darkening layer provided on at least one surface of the electric conducting pattern and in a region corresponding to the electric conducting pattern,
wherein total reflectance measured by using a total reflectance measuring device with an assumption of ambient light on one surface from which the darkening layer is visible is reduced by 20% or more as compared to the conducting substrate having the same constitution except that the electric conducting pattern is formed of Al and does not comprise the darkening layer.

3. The conducting substrate of claim 1, wherein the darkening layer is provided on an upper surface and a lower surface of the electric conducting pattern.

4. The conducting substrate of claim 1, wherein in a color range of a pattern region formed of the darkening layer and the electric conducting pattern, which is measured from a surface from which the darkening layer of the conducting substrate is visible, an L value is 20 or less, an A value is −10 to 10, and a B value is −70 to 70 based on a CIE LAB color coordinate.

5. The conducting substrate of claim 1, wherein total reflectance of a pattern region formed of the darkening layer and electric conducting pattern, which is measured from a surface from which the darkening layer of the conducting substrate is visible, is 17% or less based on external light of 550 nm.

6. The conducting substrate of claim 1, wherein the electric conducting pattern is a single film or a multilayered film comprising gold, silver, aluminum, copper, neodymium, molybdenum, nickel, or an alloy thereof.

7. The conducting substrate of claim 1, wherein a line width of the electric conducting pattern is 10 μm or less, a thickness thereof is 10 μm or less, and a pitch thereof is 600 μm or less.

8. The conducting substrate of claim 1, wherein a line width of the electric conducting pattern is 7 μm or less, a thickness thereof is 1 μm or less, and a pitch thereof is 400 μm or less.

9. The conducting substrate of claim 1, wherein a line width of the electric conducting pattern is 5 μm or less, a thickness thereof is 0.5 μm or less, and a pitch thereof is 300 μm or less.

10. The conducting substrate of claim 1, wherein the electric conducting pattern is a regular pattern, and comprises cross points formed by crossing a plurality of predetermined lines among lines constituting the conducting pattern, and the number of cross points is 3,000 to 123,000 in an area of 3.5 cm ×3.5 cm.

11. The conducting substrate of claim 10, wherein the number of cross points is 5,000 to 35,000 in the area of 3.5 cm ×3.5 cm.

12. The conducting substrate of claim 10, wherein the number of cross points is 10,000 to 35,000 in the area of 3.5 cm ×3.5 cm.

13. The conducting substrate of claim 1, wherein the darkening layer comprises one or more selected from the group consisting of Ni, Mo, Ti, Cr, Al, Cu, oxides thereof, nitrides thereof, oxides-nitrides thereof, carbides thereof and an alloy thereof.

14. The conducting substrate of claim 1, wherein the electric conducting pattern is a mesh pattern type.

15. The conducting substrate of claim 1, wherein an opening ratio of the electric conducting pattern is 70% or more.

16. A touch screen comprising:
a conducting substrate that comprises a board, an electric conducting pattern provided on at least one surface of the board, and a darkening layer provided on at least one surface of the electric conducting pattern and in a region corresponding to the electric conducting pattern, and
an additional transparent board on a surface from which the darkening layer of the conducting substrate is visible,
wherein a reflective diffraction intensity of a reflective diffraction image obtained by radiating light emitted from a point light source on one surface from which the darkening layer of the conducting substrate is visible is reduced by 60% or more as compared to the conducting substrate having the same constitution except that the electric conducting pattern is formed of Al and does not comprise the darkening layer.

17. A touch screen comprising:
a conducting substrate that comprises a board, an electric conducting pattern provided on at least one surface of the board, and a darkening layer provided on at least one surface of the electric conducting pattern and in a region corresponding to the electric conducting pattern, and
an additional transparent board on a surface from which the darkening layer of the conducting substrate is visible,
wherein total reflectance measured by using a total reflectance measuring device with an assumption of ambient light on one surface from which the darkening layer of the conducting substrate is visible is reduced by 20% or more as compared to the conducting substrate having the same constitution except that the electric conducting pattern is formed of Al and does not comprise the darkening layer.

18. The touch screen of claim 16, wherein the darkening layer is provided on an upper surface and a lower surface of the electric conducting pattern.

19. The touch screen of claim 16, wherein the additional transparent board is reinforced glass or transparent plastic.

20. The touch screen of claim 16, wherein in a color range of a pattern region formed of the darkening layer and the electric conducting pattern, which is measured from the surface from which the darkening layer of the conducting substrate is visible, an L value is 20 or less, an A value is −10 to 10, and a B value is −70 to 70 based on a CIE LAB color coordinate.

21. The touch screen of claim 16, wherein total reflectance of a pattern region formed of the darkened layer and electric conducting pattern, which is measured from a surface from which the darkened layer of the conducting substrate is visible, is 17% or less based on external light of 550 nm.

22. The touch screen of claims 16, wherein the electric conducting pattern is a single film or a multilayered film comprising gold, silver, aluminum, copper, neodymium, molybdenum, nickel, or an alloy thereof.

23. The touch screen of claim 16, wherein a line width of the electric conducting pattern is 10 μm or less, a thickness thereof is 10 μm or less, and a pitch thereof is 600 μm or less.

24. The touch screen of claim 16, wherein a line width of the electric conducting pattern is 7 μm or less, a thickness thereof is 1 μm or less, and a pitch thereof is 400 μm or less.

25. The touch screen of claim 16, wherein a line width of the electric conducting pattern is 5 μor less, a thickness thereof is 0.5 μm or less, and a pitch thereof is 300 μm or less.

26. The touch screen of claim 16, wherein the darkening layer comprises one or more selected from the group consisting of Ni, Mo, Ti, Cr, oxides thereof, nitrides thereof, oxides-nitrides thereof, carbides thereof and an alloy thereof.

27. The touch screen of claim 16, wherein the electric conducting pattern is a mesh pattern type.

28. The touch screen of claim 16, wherein an opening ratio of the touch screen is 70% or more.

29. A display comprising:
the touch screen of claim 16, and a display module.

* * * * *